United States Patent
Casagrande (10) Patent No.: US 7,116,747 B2
(45) Date of Patent: **\*Oct. 3, 2006**

(54) PHASE-SWITCHED DUAL-MODE COUNTER CIRCUIT FOR A FREQUENCY SYNTHESIZER

(75) Inventor: Arnaud Casagrande, Lignières (CH)

(73) Assignee: Asulab S.A., Marin (CH)

( * ) Notice: Subject to any disclaimer, the term of this patent is extended or adjusted under 35 U.S.C. 154(b) by 52 days.

This patent is subject to a terminal disclaimer.

(21) Appl. No.: 10/491,365

(22) PCT Filed: Sep. 27, 2002

(86) PCT No.: PCT/EP02/11178

§ 371 (c)(1),
(2), (4) Date: Mar. 31, 2004

(87) PCT Pub. No.: WO03/032495

PCT Pub. Date: Apr. 17, 2003

(65) Prior Publication Data

US 2004/0239434 A1     Dec. 2, 2004

(30) Foreign Application Priority Data

Oct. 5, 2001     (EP) ................................. 01203761

(51) Int. Cl.
*H03L 21/00* (2006.01)
(52) U.S. Cl. ......................................... 377/47; 377/48
(58) Field of Classification Search ................ 377/47, 377/48; 327/115, 117
See application file for complete search history.

(56) References Cited

U.S. PATENT DOCUMENTS

| 5,311,152 A | 5/1994 | Lautzenhiser |
| 5,781,054 A | 7/1998 | Lee |
| 6,037,339 A | 3/2000 | Loozen et al. |
| 6,067,339 A * | 5/2000 | Knapp et al. ................. 377/47 |
| 6,583,674 B1 * | 6/2003 | Melava et al. ................ 331/16 |
| 6,614,274 B1 * | 9/2003 | Shi et al. .................... 327/115 |
| 6,760,398 B1 * | 7/2004 | Casagrande ................. 377/47 |

\* cited by examiner

FOREIGN PATENT DOCUMENTS

EP     1 133 058 A2     9/2001

OTHER PUBLICATIONS

Craninckx J. et al: "A 1.75-GHZ/3-V Dual-Modulus Divide-By-128/129 Prescaler In 0.7-MUM CMOS", IEEE Journal of Solid-State Circuits, IEEE Inc., New York, US, vol. 31, No. 7, Jul. 1, 1996 pp. 890-897, XP000632373 ISSN: 0018-9200.

*Primary Examiner*—Timothy P. Callahan
*Assistant Examiner*—Cassandra Cox
(74) *Attorney, Agent, or Firm*—Sughrue Mion, PLLC (57) ABSTRACT

A dual-modulus prescaler circuit for a frequency synthesizer comprises a plurality of asynchronous dividers-by-two connected in series, a phase selector unit (11) between two dividers-by-two (10, 12) and a control unit (13) for supplying control signals (S0, S1, S2) to the selector unit as a function of a selected mode. Said selector unit receives four signals phase shifted by 90° in relation to each other from a master-slave first divider and supplies a selected one of the four phase shifted signals. The control signals (S0, S1, S2) are supplied to the selector unit for selecting one of the four phase shifted signals (F2) at the output in a particular division period. As a function of the control signals supplied by the control unit (13) in one selected of the modes, the selector unit effects phase switching in each division period between two phase shifted signals selected by each branch. The second phase shifted signal i in phase lead of 90° in relation to the first phase shifted signal.

9 Claims, 6 Drawing Sheets

PHASE-SWITCHED DUAL-MODE COUNTER CIRCUIT FOR A FREQUENCY SYNTHESIZER

BACKGROUND OF THE INVENTION

The invention relates to a switched phase dual-modulus prescaler or divider counter circuit for a frequency synthesizer. The circuit divides the frequency of at least one high-frequency signal by a first factor in a first selected mode and by a second factor in a second selected mode. It comprises a plurality of asynchronous dividers-by-two connected in series. One of the dividers-by-two is of the master-slave type for receiving two input signals in phase opposition, and for supplying four signals phase shifted by 90° in relation to each other. The circuit further comprises a phase selector unit inserted between two of the dividers-by-two for receiving the four phase shifted signals from the master-slave first divider and for supplying a selected one of the four phase shifted signals to the second divider. A control unit supplies control signals to the phase selector unit for selecting a phase shifted signal.

Frequency synthesizers are used to supply high-frequency signals in wireless communication systems, for example, and in telecommunication systems in general.

The high-frequency signals may be used to demodulate received RF signals, for example.

Figure 1:
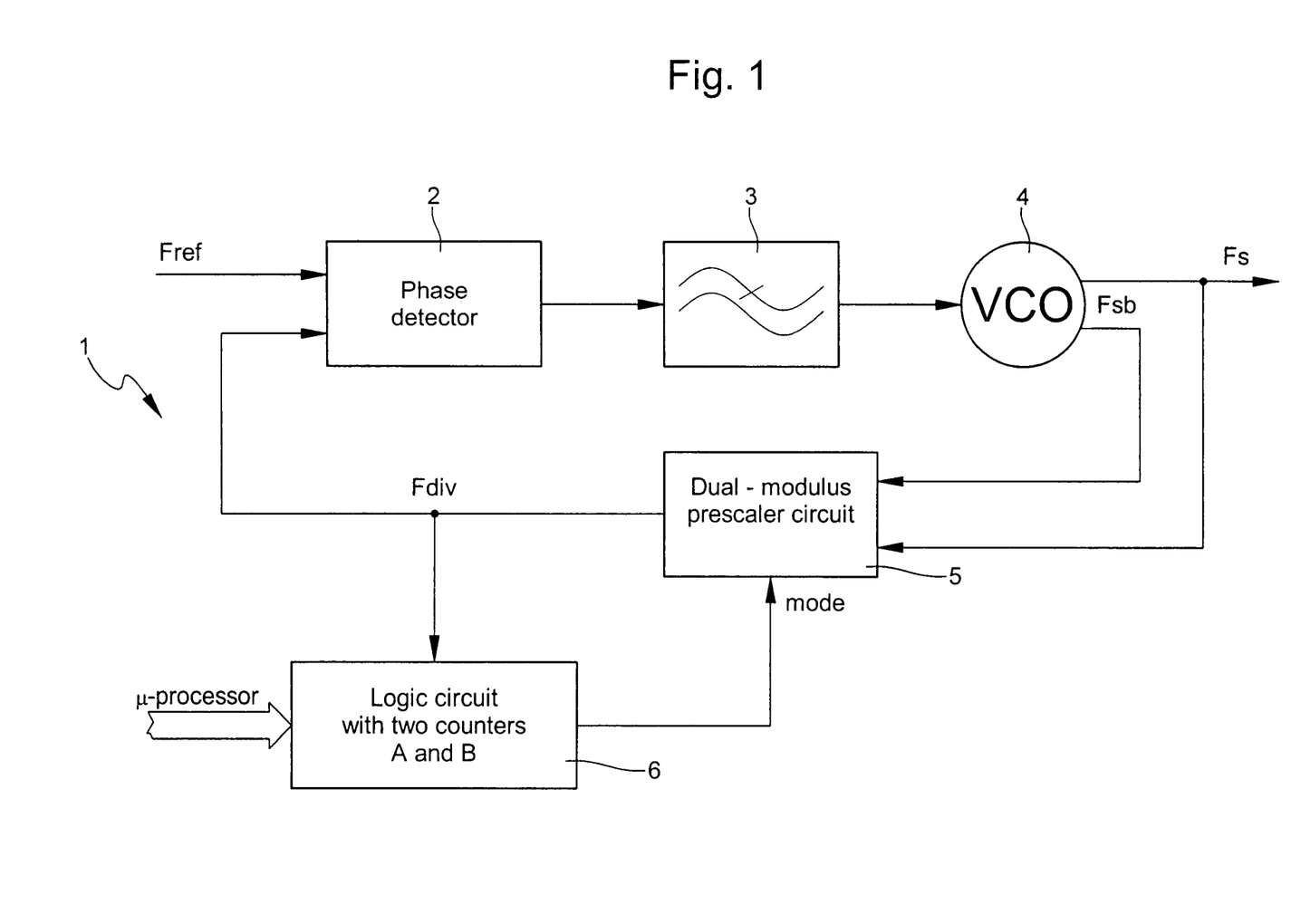
FIG. 1, already cited, represents a conventional frequency synthesizer with a dual-modulus prescaler circuit.

FIG. 1 represents one embodiment of a conventional frequency synthesizer with a dual-modulus prescaler circuit. The synthesizer includes a reference oscillator, not shown, which supplies a reference signal Fref at a stable frequency to a phase and frequency detector 2 which also receives a divided frequency signal Fdiv from a dual-modulus prescaler circuit 5 in order to compare the reference signal and the divided frequency signal. The detector supplies a comparison signal that is a function of the phase and frequency difference between the signals Fref and Fdiv to a low-pass filter 3 connected to a voltage-controlled oscillator (VCO) 4. This voltage controlled oscillator receives a voltage control signal originating from the low-pass filter so that the oscillator generates at least a high frequency signal dependent on the comparison between signals Fref and Fdiv.

The voltage-controlled oscillator may be a differential type oscillator supplying two high-frequency signals Fs and Fsb in phase opposition to the prescaler circuit 5 in a phase-locked loop. At least one of high frequency signals Fs or Fsb can thus be used for demodulation operations in a radio-frequency signal receiver for example.

The dual-mode prescaler circuit 5 performs frequency division by a division factor that depends on a selected mode. To this end, a logic circuit with two counters A and B is generally used to provide the prescaler circuit with a mode selection facility. The logic circuit 6, which is well known in this technical field, is controlled by a microprocessor and by the divided frequency signal Fdiv. The two counters A and B are in principle clocked synchronously by the same clock signal, but the number counted by each counter prior to a reset is different. This enables the logic circuit 6 to supply a mode signal to the prescaler circuit in order to change division mode in particular periods.

Several embodiments of dual-modulus type prescaler circuits have already been proposed, but since these circuits have to operate at high speed, they are more difficult to design than simple fixed division ratio frequency dividers. One problem is that, in achieving frequency division using first and second division factors, the logic part of the circuit slows down the whole of the circuit.

U.S. Pat. No. 6,067,339 describes one example of a conventional dual-modulus prescaler circuit. The division factor is either 64 or 65, on the one hand, or 128 or 130, on the other hand, depending on the mode selected. The circuit has a synchronous division first part for selecting the division factor and an asynchronous division second part. For that, the circuit therefore comprises a plurality of dividers-by-two connected in series. A unit made up of synchronous dividers divides by 4 or 5 and the other dividers are asynchronous.

The synchronous divider unit employs a certain number of logic gates to enable the circuit to divide the high-frequency signal by a selected one of the two division factors. The logic gates on the critical path of said synchronous divider unit may cause a reduction in the maximum input frequency. The unit comprises three D-type flip-flops clocked by the same clock signal, which is an output signal from a first divider-by-two. However, one of the flip-flops of this unit is used only to obtain the division factor of 65 or 130.

A synchronous divider unit of the above type is usually intended to receive the high-frequency signal directly. As a result, the flip-flops in the synchronous divider unit operate at a high frequency, which may be a disadvantage from the power consumption point of view in particular. A partial solution to this problem is the circuit described in U.S. Pat. No. 6,037,339, in which an asynchronous divider-by-two precedes the synchronous divider unit. However, the first divider merely divides by two the frequency of the high-frequency signal, which means that the flip-flops of the synchronous divider unit must operate at an even higher frequency.

Another disadvantage of this type of circuit is that fine adjustment of frequency division by the two division factors is not possible, in particular because a first divider-by-two is used to reduce the frequency of the high-frequency signal. It is therefore not possible to provide frequency divisions by division factors having a smaller difference between them.

An example of a dual-modulus prescaler circuit that avoids the use of a synchronous divider unit is described in an article by Mrs. Jan Craninckx and Michiel S. J. Steyaert published in the IEEE integrated circuit journal, Volume 31 of 7 Jul. 1996. Like the present invention, this dual-modulus prescaler circuit comprises only asynchronous dividers-by-two connected in series. This dual-modulus circuit therefore comprises a chain of seven asynchronous dividers-by-two that is interrupted by a phase selector unit to enable frequency division by 128 or by 129. Only the first divider-by-two operates at the highest frequency, i.e. the frequency of at least one received high-frequency signal Fin.

A master-slave second divider-by-two is connected to the first divider-by-two and supplies four signals phase shifted by 90° in relation to each other to the phase selector unit on the basis of two phase-opposition signals supplied by the first divider. Relative to the first of the four signals supplied by the master-slave divider, the other signals are therefore phase shifted by 90°, 180° and 270°. The selector unit comprises two differential amplifiers for amplifying and selecting the four phase shifted signals and selection means for supplying a selected one of the four signals at the output.

The selector unit is controlled by a control logic unit as a function of the mode selected. In a first selected mode, said circuit must divide the frequency of the high-frequency signals by a division factor equal to 128. In this case, in all division periods, the selector unit selects only one of the four signals. In a second selected mode, the circuit must divide the frequency of the high-frequency signals by a division factor equal to 129. To obtain this factor, phase switching between two of the four phase shifted signals is effected within the selector unit as a function of control signals produced by the control unit. In each division period, phase switching between a first signal supplied by the second divider and a second signal in a phase delay of 90° relative to that of the first signal is therefore obtained. To this end, the control unit is clocked by the output signal of the last divider-by-two so that control signals are supplied to the phase selector unit to effect the phase switching in each division period.

To modify the state of the control unit as a function of a selected mode, a NAND type logic gate receives the mode signal and the output signal from the last divider-by-two. If the value of the mode signal is 0, the variation of the output signal at the control unit has no effect. On the other hand, if the value of the mode signal is 1, the output signal is inverted by the NAND gate to clock the control unit and enable the selector unit to perform the signal phase switching. Note that the control portion of the selector unit is no longer entirely synchronous.

A major drawback of the solution described in the article by Mrs. Craninckx and Steyaert is that voltage drops may occur in the output signal of the selector unit on the occasion of phase switching in the second selected mode. These voltage drops are caused by the changeover in the selector unit from the first signal to the second signal, which is in phase delay of 90° in relation to the first signal. In this case, the division factor may no longer be equal to 129, and may be much lower than 128, because of a supplementary pulse in the output signal of the selector unit. To avoid this problem, which is caused by the fact that the logic part for supplying control signals does not react quickly enough, the frequency of the high-frequency signals supplied to the input of said circuit must be high. On the other hand, if the frequency of said high-frequency signals is not sufficiently high, voltage drops occur in the output signal at the time of phase switching.

To solve this problem, it is necessary to slow down the beginning and/or the slope of the transitions in the control signals supplied by the control unit. It may prove difficult to adjust the beginning and/or the slope of the transitions in the control signals to take account of the frequency of the high-frequency signals received that is to be divided.

Figure 5A:
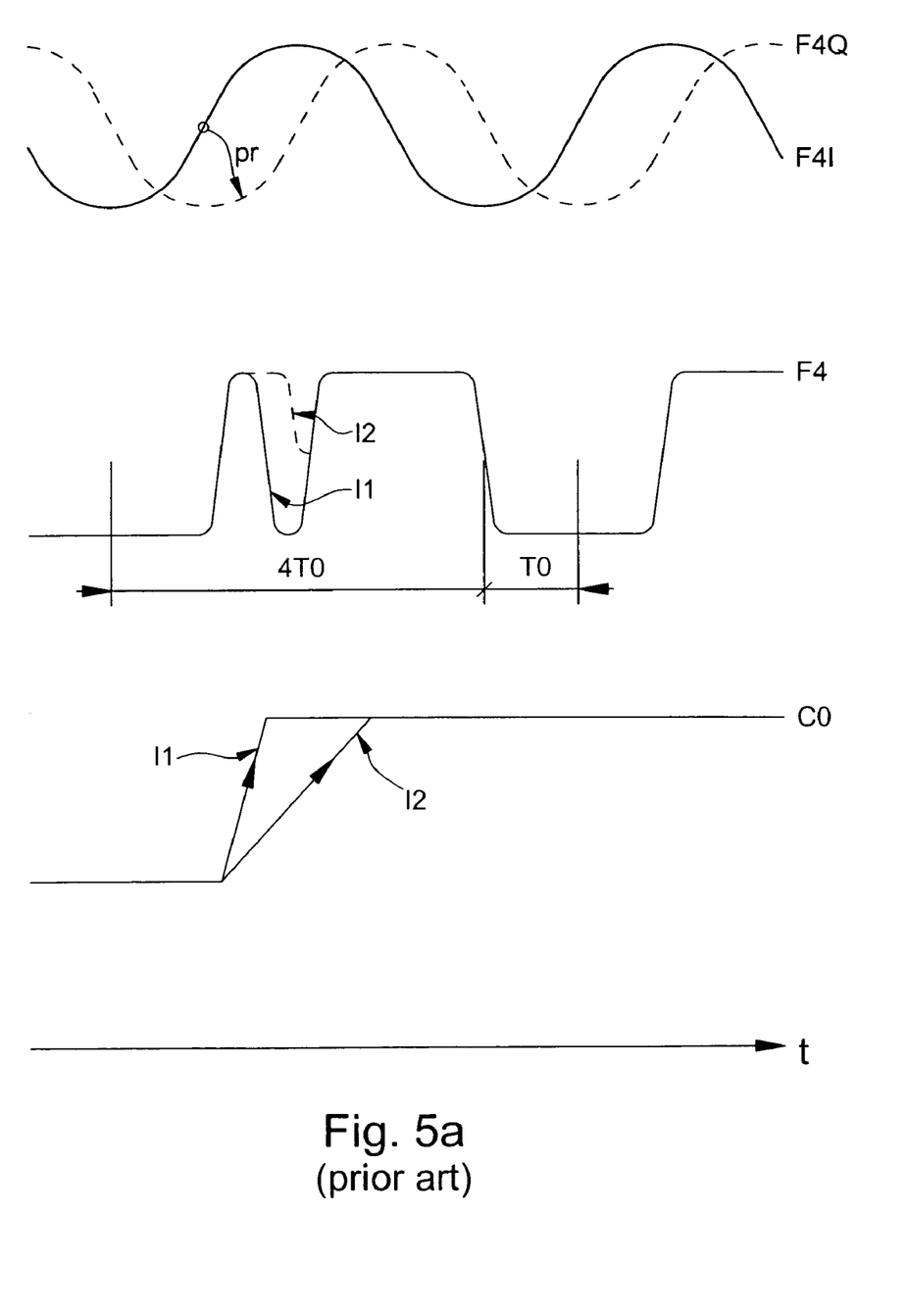

As can be seen in FIG. 5a, if the control signal C0 from the selection means has a relatively steep transition slope I1, a high voltage drop occurs in the output signal F4. On the other hand, if the transition slope I2 is gentle, the voltage drop in the output signal F4 has virtually no further effect on the division factor. Nevertheless, it is clear that the circuit proposed in the article by Mrs. Jan Craninckx and Michiel S. J. Steyaert is not normally able to divide signals whose frequency is relatively low. The high-frequency signals must have a frequency higher than a particular minimum frequency. Moreover, the problem of voltage drops is also dependent on the supply voltage of the dual-modulus prescaler circuit. Because of this, the circuit can operate only between particular minimum and maximum voltages.

SUMMARY OF THE INVENTION

Thus a main object of the invention is to alleviate the drawbacks of the prior art by providing a high-speed dual-modulus prescaler circuit with means in particular for avoiding inopportune voltage drops when switching phase.

To this end, the invention consists in a dual-modulus prescaler circuit of the type previously cited wherein, in one selected of the two modes, the control unit is adapted to supply control signals to the selector unit so that it effects phase switching in each division period between two phase shifted signals selected by each branch, the second phase shifted signal being in phase lead of 90° in relation to the first phase shifted signal.

One advantage of the dual-modulus prescaler circuit of the invention is that it is independent of the frequency of the high-frequency signals applied to the input of the circuit.

Thanks to phase switching between a first signal and a second signal in a phase lead of 90° in relation to the first signal, no voltage drop occurs in the output signal of the selector unit. Because of this, it is not necessary to slow down the beginning and/or the slope of control signal transition.

The high-speed dual-modulus prescaler circuit of the present invention may operate from a particular minimum supply voltage up to any higher voltage. The supply voltage has no effect on switching the phase of the phase shifted signals.

Another advantage of the dual-modulus prescaler circuit of the invention is that the two division factors can be very close together. This allows fine adjustment of the frequency of the high-frequency signals in the phase-locked loop of the frequency synthesizer. In a first selected mode, the frequency of the high-frequency signals may be divided by a first factor equal to 64, for example. In a second selected mode, the frequency of the high-frequency signals may be divided by a second factor equal to 63,5, for example.

Another advantage of the dual-modulus prescaler circuit of the invention is that the control unit is clocked synchronously by a clock signal corresponding to the output signal of the last divider-by-two of the chain of dividers. That clock signal is therefore never interrupted to clock operations in the control unit. Moreover, the control signals produced by said control unit are free of disturbances and/or delays.

The phase selector unit preferably has a first selection branch receiving two of the four phase shifted signals, a second selection branch receiving the other two phase shifted signals, and a selection element connected to each branch. Each branch comprises a differential amplifier controlled by a control signal to select one of the two phase shifted signals. Note that each amplifier control signal is stabilised before each change of the signals from which one is to be selected by the selection element of the selector unit.

Note that the use of dividers-by-two, especially asynchronous dividers, in the divider chain facilitates the implementation of said high-speed dual-modulus prescaler circuit.

BRIEF DESCRIPTION OF THE DRAWINGS

The objects, advantages and features of the dual-modulus prescaler circuit will become more clearly apparent in the light of the following description of embodiments shown in the drawings, in which.

DETAILED DESCRIPTION OF THE INVENTION

Note that, because they are well known to the person skilled in the art, the components of the dual-modulus prescaler or divider counter circuit are not described in detail in the following description.

As described hereinabove with reference to FIG. 1, the dual-modulus prescaler circuit is used in a control loop of a frequency synthesizer. The synthesizer may be used in radio-frequency signal transmitters and/or receivers used in small portable devices for short-range wireless communications, for example. The frequency of radio-frequency signals for short-range wireless communications is close to 0.5 GHz, for example 434 MHz. As a general rule, the synthesizer supplies high-frequency signals for demodulating radio-frequency signals. The synthesizer may be designed for incorporation into a wristwatch, for example, which contains a small accumulator or battery. The dual-modulus prescaler circuit must in particular consume little current during periods in which the synthesizer is operating.

The dual-modulus prescaler circuit of the invention is based in part on the circuit described in the article by Mrs. Jan Craninckx and Michiel S. J. Steyaert published in the IEEE integrated circuit journal, Volume 31 of 7 Jul. 1996. The reader may therefore refer to that article for more details of the design of certain equivalent components of the dual-modulus prescaler circuit of the invention.

Figure 2:
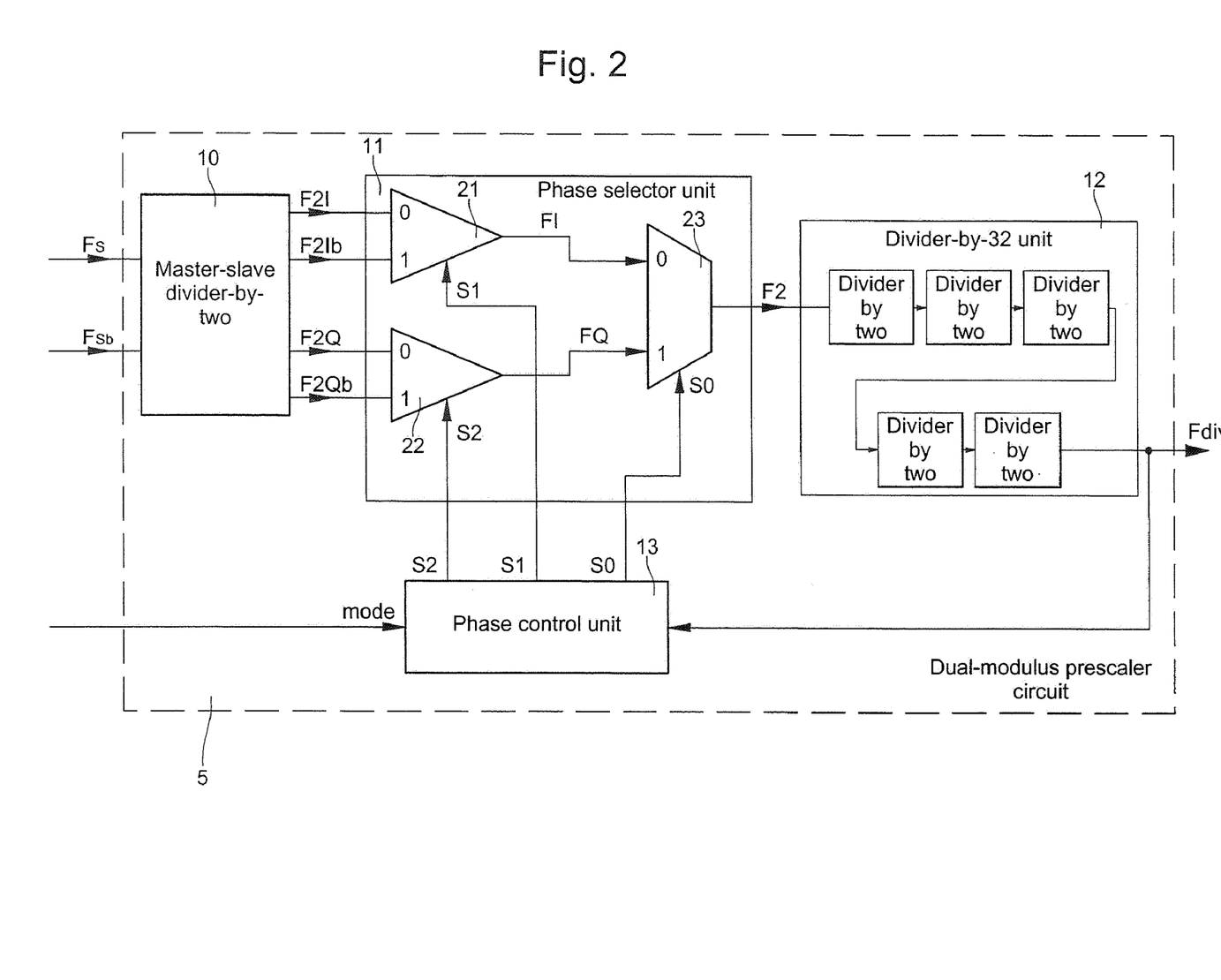
FIG. 2 represents a dual-modulus prescaler circuit of the invention.

FIG. 2 shows the dual-modulus prescaler circuit 5, which is designed to divide by a first factor N in a first selected mode or by a second factor N-M in a second selected mode. The factor N is preferably equal to 64, which is a power of 2, and the factor N-M is preferably equal to 63,5. Other division factor values may be chosen, of course. For example, if the selector unit is between the second and third dividers-by-two, the division factor will be 64 or 63.

The dual-modulus prescaler circuit 5 comprises a chain of asynchronous dividers-by-two 10, 12, a phase selector unit 11 between two of the dividers-by-two, and a phase control unit 13 connected to the selector unit to supply it with control signals S0, S1 and S2 depending on the mode selected. The phase selector unit 11 is between a master-slave first divider 10 and the first divider-by-two of the divider unit 12.

The master-slave divider supplies to the phase selector unit 11 four signals F2I, F2Ib, F2Q and F2Qb with a relative phase difference of 90° based on two high-frequency signals Fs and Fsb in phase opposition. The two high-frequency signals are supplied by the differential voltage-controlled oscillator (VCO) of the synthesizer. Note that the first master-slave divider is the only component that operates at the highest frequency.

The frequency of the output signal F2 from the phase selector unit 11 is divided in a divider-by-32 unit 12. The divider-by-32 unit consists of five asynchronous dividers-by-two connected in series. The output signal Fdiv from the divider-by-32 unit provides a clock signal for the phase control unit 13 used to clock the operations effected by the control unit. The output signal Fdiv is also a divided frequency signal and is required for the comparison effected in the phase and frequency detector of the frequency synthesizer.

The phase selector unit 11 comprises two amplifying selection branches. Each branch includes a differential amplifier 21, 22. Each amplifier 21 or 22 receives two of the four phase shifted signals from the master-slave first divider 10. As the signals from this divider have a relatively low amplitude, it is necessary to amplify them using the amplifiers in the two branches.

For example, the amplifier 21 receives positive and negative in-phase signals F2I and F2Ib, i.e. two first signals in phase opposition, and the amplifier 22 receives positive and negative quadrature signals F2Q and F2Qb, i.e. two second signals in phase opposition. One of the two signals is selected in each branch with the aid of control signals S1, S2. The control signal S1 selects either the signal F2I or the signal F2Ib. If the value of the control signal S1 is 0, the signal F2I is amplified and selected by amplifier 21, whereas if the value of the control signal S1 is 1, the opposite signal F2Ib is amplified and selected by the amplifier 21. Similarly, the control signal S2 selects either the signal F2Q or the signal F2Qb. If the value of the control signal S2 is 0, the signal F2Q is amplified and selected by the amplifier 22, whereas if the value of the control signal S2 is 1, the opposite signal F2Qb is amplified and selected by the amplifier 22. Clearly the choice of the phase shifted signals for each amplifier may be changed, but for the purposes of the present invention it is found to be preferable to choose the signals for each amplifier in the manner described above.

Each of the amplifiers 21, 22 is supplied with power by a power supply, not shown, providing sufficient current to guarantee fast operation of the dual-modulus prescaler circuit. However, said amplifiers may also be supplied with power by a voltage source.

The phase selector unit 11 further comprises a selection element 23 for selecting one of the phase shifted signals to be supplied at the output of said unit. The selection element may be a multiplexer, for example. The selection element receives the signals FI and FQ of each branch and a control signal S0. The signal S0 enables the selection element 23 to select one or the other of the signals FI and FQ to be supplied at the output. If the value of the signal S0 is 0, the signal FI is selected, whereas if the value of the signal S0 is 1, the signal FQ is selected.

In a first selected mode, no phase switching is effected in the phase selector unit 11. Thus the selector unit merely selects one of the four phase shifted signals to supply an output signal F2 at the same frequency as the selected phase shifted signal. The same phase shifted signal constitutes the output signal F2 of the selector unit in each division period. The division period is defined relative to the frequency of the divided frequency signal Fdiv at the output of the prescaler or divider counter circuit 5. In this first mode, the control signals S0, S1 and S2 supplied by the control unit 13 therefore do not vary with time.

In a second selected mode, phase switching is effected in the selector unit at the end of each division period. The phase switching in the selector unit corresponds to a transition between the first signal received at the input of the selector unit and a second signal in phase lead of 90°. The selector unit 11 therefore receives control signals S0, S1 and S2, some of which change state in each division period 1/Fdiv for phase switching. As the phase difference between the phase shifted signals is 90° and only one divider-by-two precedes the selector unit, the second division factor can therefore be equal to 63,5. The present invention uses six dividers-by-two associated with the phase selector unit to obtain a factor of this kind. The phase switching, i.e. the transition between two of the four phase shifted signals in each division period, is explained with reference to FIG. 4 in particular.

Figure 3:
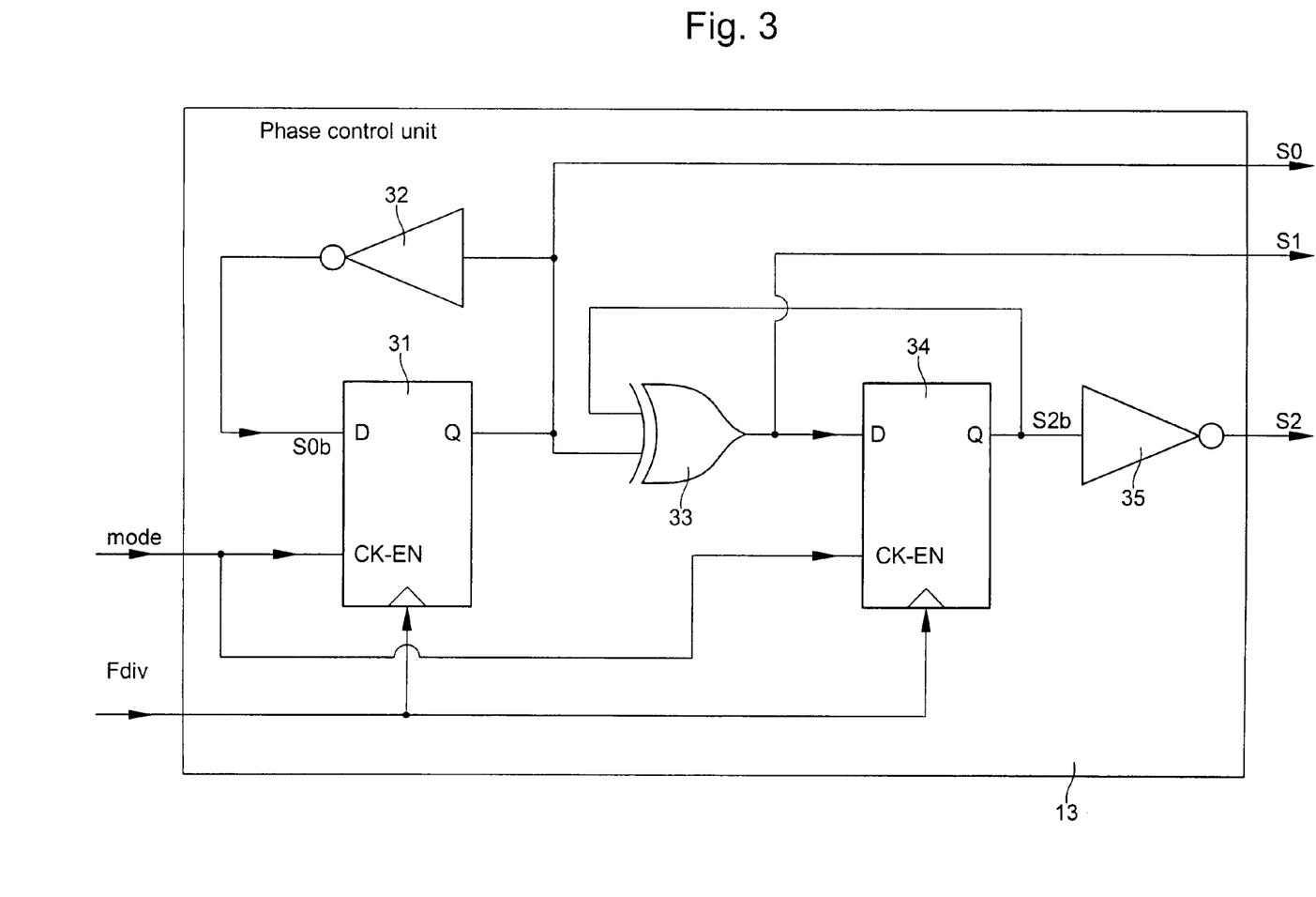
FIG. 3 represents one embodiment of a control unit for the dual-modulus prescaler circuit of the invention, which comprises a plurality of flip-flops and logic gates.

The phase control unit 13 represented in FIG. 3 may be configured to supply control signals S0, S1 and S2 to the selector unit depending on the state of a mode signal. In this embodiment, the control unit 13 has a sequential logic part and a combinatory logic part. The sequential logic part comprises two flip-flops 31 and 34 and the combinatory logic part comprises an arrangement of logic gates 32, 33 and 35. Note that the sequential logic part is clocked synchronously by a single clock signal Fdiv. This clock signal is the output signal of the divider-by-two of the chain of dividers.

When the mode signal is at 1, all the D-type flip-flops transmit the state of the input signal to their output Q on each clock pulse produced by the signal Fdiv. On the other hand, when the mode signal is at 0, the state of the outputs of each flip-flop does not change on each clock pulse produced by the signal Fdiv.

An inverter 32 is connected between the output Q and the input D of the first flip-flop 31 in order for the output signal S0 to be inverted by said inverter to yield the signal S0b. Because of this, the signal S0 changes state on each clock pulse. It goes from low to high when signal S0b is high and from high to low when the signal S0b is low.

An XOR logic gate 33 receives at its input the signal S0 and the output signal Q of the second flip-flop 34, which corresponds to the signal S2b, and supplies a signal S1 at the input of the second flip-flop. Finally, the control signal S2 is obtained by the inverter 35 inverting the signal S2b.

Note that the control unit 13 operates with signals whose frequency is close to 32 times lower than those of the phase shifted signals at the input of the amplifiers of each branch. The low current consumption of the flip-flops and the logic gates of the unit 13 has only a slight effect on the consumption of the dual-modulus prescaler circuit compared to the phase selector unit 11.

In another embodiment, not shown in the figures, the control unit may comprise a counter and a non-volatile read-only memory (ROM).

The ROM contains a certain number of memory locations storing 3-bit binary words representing the state of each control signal at a given time. In the second selected mode, all the memory locations may be addressed successively and cyclically by the counter. The counter therefore moves on from the preceding memory location address to the next address on each clock pulse. The clock signal is produced by the output signal Fdiv of the last divider-by-two of the chain of dividers. Because of this, some control signals change state on each clock pulse on moving from the preceding memory location to the next memory location. In the first selected mode, only one memory location is selected on each clock pulse.

The control unit with the ROM is not described in detail here as it constitutes part of the background knowledge of the person skilled in the art.

Figure 4:
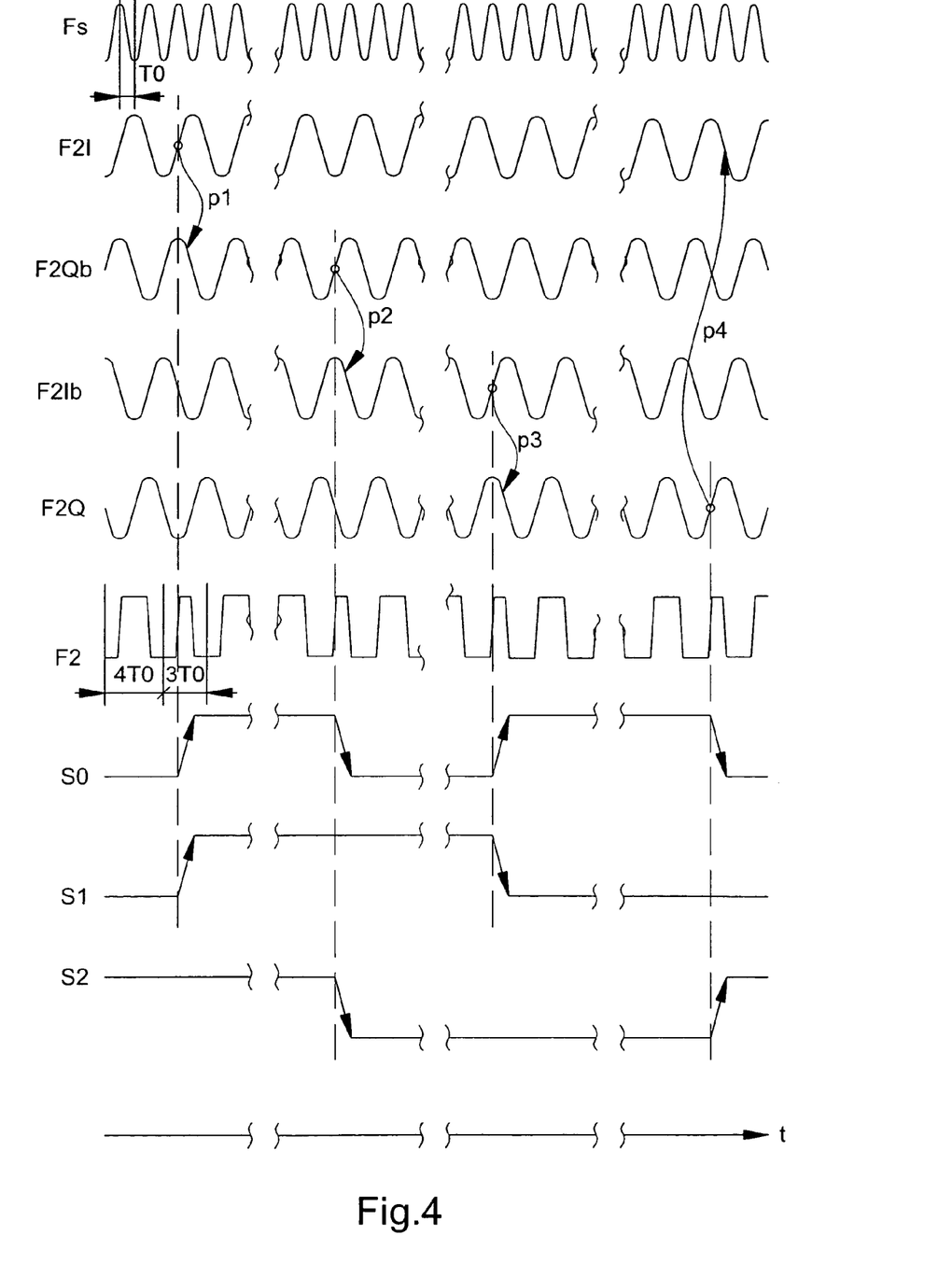
FIG. 4 shows graphs of phase switching between phase shifted signals in the selector unit as a function of control signal transitions and the selector unit output signal resulting from switching the phase of the phase shifted signals, FIG. 5a, already cited, shows graphs of phase switching between a first signal and a second signal in phase delay of 90° in relation to the first signal and the selector unit output signal resulting from switching the phase of the phase shifted signals in accordance with the prior art.

The switching of the phase shifted signals in the phase selector unit as a function of the control signals is explained next with reference to FIG. 4. This figure comprises graphs of signals, in particular of signals in the selector unit. Four phase lead switching operations p1 to p4 occurring in the selector unit in each division period are shown.

In the graphs, the signals Fs, F2I, F2Ib, F2Q and F2Qb are shown as approximately sinusoidal. Because the master-slave first divider operates at a high frequency, it is advantageous to use sinusoidal signals rather than substantially rectangular pulse signals. This avoids a frequency spectrum that is too wide if the signals are rectangular pulses and reduces the consumption of the first divider.

The frequency of the high-frequency signal Fs may be of the order of 434 MHz. After the first divider-by-two, the frequency of all the phase shifted signals F2I, F2Q, F2Ib and F2Qb is the frequency of the signal Fs divided by two. Relative to the signal F2I, the signal F2Qb is in phase lead of 90°, the signal F2Ib is in phase lead of 180°, and the signal F2Q is in phase lead of 270°. The signals F2I, F2Q, F2Ib and F2Qb are therefore phase shifted relative to each other by a half-period T0 of the signal Fs.

When the signal S2 is at 1 and the signals S0 and S1 go from 0 to 1, the selector unit effects a first phase switching operation p1 between the signals F2I and F2Qb. Thus the output signal F2, which has to represent a selected one of the phase shifted signals, has a pulse shorter by a half-period T0 at the end of each division period, caused by the phase switching. Thus the period of the signal F2 with this short pulse is 3T0, whereas before switching it was 4T0.

When the signal S1 is at 1 and the signals S0 and S2 go from 1 to 0, a second phase switching operation p2 between the signal F2Qb and F2Ib is effected in the selector unit. Again, the output signal F2 has a pulse shorter by a half-period of the signal Fs at the end of the division period, caused by the phase switching.

When the signal S2 is at 0, the signal S0 goes from 0 to 1 and the signal S1 goes from 1 to 0, the selector unit effects a third phase switching operation p3 between the signals F2Ib and F2Q. Again, the output signal F2 has a pulse shorter by a half-period of the signal Fs at the end of the division period, caused by the phase switching.

Finally, when the signal S1 is at 0, the signal S0 goes from 1 to 0 and the signal S2 goes from 0 to 1, the selector unit effects a fourth phase switching operation p4 between the signals F2Q and F2I. Again, the output signal F2 has a pulse shorter by a half-period of the signal Fs at the end of the division period, caused by the phase switching.

It is therefore clear that by reducing the pulse of the signal F2 by a half-period T0 of the signal Fs in each division period, the prescaler circuit divides the frequency of the signal Fs by 63,5. As the voltage pulse is relatively short at the time of switching with a phase lead, there inevitably follows a slight increase in the current compared to conventional switching with a phase delay.

Figure 5B:
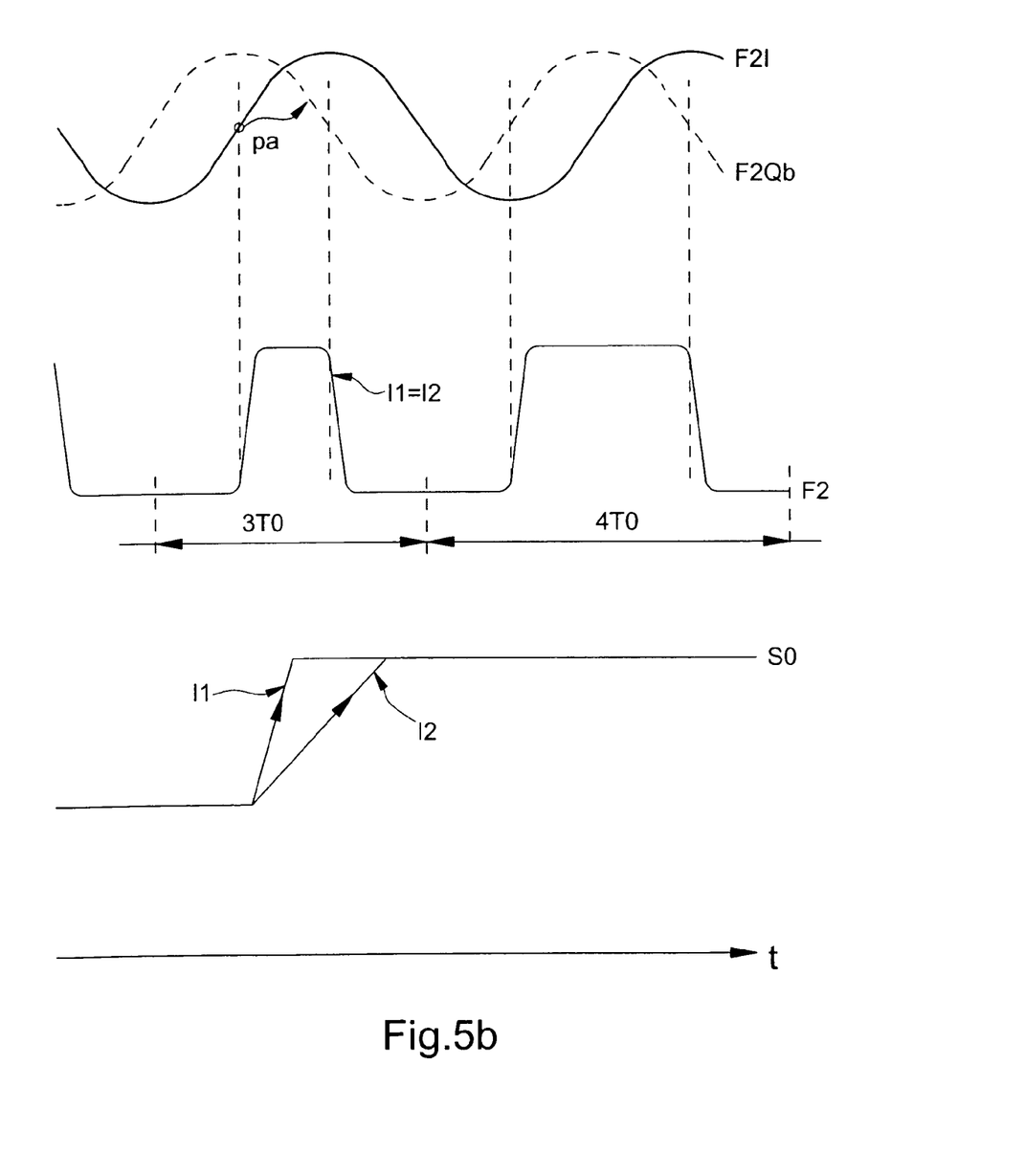
FIG. 5b shows graphs of phase switching between a first signal and a second signal in phase lead of 90° in relation to the first signal and the selector unit output signal resulting from switching the phase of the phase shifted signals in accordance with the invention.

Refer now to FIGS. 5a and 5b, which are graphs showing the advantage of switching with a phase lead in the selector unit over switching with a phase delay.

FIG. 5a, which has already been described, shows the waveform of the output signal F4 of the phase selector unit on switching between a first signal F4I and a second signal F4Q in phase delay of 90° in relation to the first signal. The dual-modulus prescaler circuit that supplies the output signal F4 is the prior art circuit described in the article by Mrs. Jan Craninckx and Michiel S. J. Steyaert.

If the frequency of the high-frequency signals is too low, the slope of the 0 to 1 transition of the control signal C0 for the purpose of the phase switching is very high. If the slope l1 of the transition of the signal C0 is relatively steep, a large voltage drop occurs in the output signal F4 at the time of the phase switching operation pr between the signals F4I and F4Q. To minimise the voltage drop, it is therefore necessary to adapt the circuit so that the slope of the transition of the control signal C0 is less steep. Accordingly, if the control signal C0 has a 0 to 1 transition slope l2, the voltage drop is sufficiently small to have no effect on the selected division factor.

Clearly it is difficult to adapt the prescaler circuit as a function of the frequency of the high-frequency signal to prevent voltage drops in the output signal F4 at the time of a phase delay switching operation. Thus the frequency of the high-frequency signal cannot be lower than a particular threshold value.

FIG. 5b shows the waveform of the output signal F2 of the phase selector unit in accordance with the invention on switching between a first signal F2I and a second signal F2Qb in phase lead of 90° in relation to the first signal. Compared to FIG. 5a, there is no voltage drop at the time of the phase switching operation pa between a first signal F2I and a second signal F2Qb in phase lead of 90° in relation to the first signal. Whether the slope of the transition of the control signal S0 is relatively more steep l1 or relatively less steep l2 has no effect on the output signal F2 of the phase selector unit. Thus carrying out phase switching in accordance with the invention, with a phase lead, prevents inopportune voltage drops in the output signal F2. The prescaler circuit of the invention is therefore able to divide signals with frequencies from a value close to 0 to a maximum value depending on the circuit fabrication process, for example. The maximum frequency limit for the high-frequency signals may exceed 2 GHz.

The person skilled in the art may arrive at multiple variants of the prescaler circuit based on the foregoing description without departing from the scope of the invention as defined by the claims. For example, the phase selector unit may comprise a multiplexer with four inputs for receiving the four phase shifted signals instead of the two amplifiers of the two branches and a selector unit. The multiplexer must be able to select one of the four signals and supply it at the output of the unit. In this case, just two control signals from the control unit are sufficient for said multiplexer to be able to select one of the four phase shifted signals.

The invention claimed is:

1. A dual-modulus prescaler circuit, in particular for a frequency synthesizer, said circuit comprising:
   a plurality of asynchronous dividers-by-two connected in series, one of the dividers-by-two a master-slave type, for receiving two input signals in phase opposition, and supplying four phase shifted signals with a relative phase difference of 90°,
   a phase selector unit between two of said dividers-by-two for receiving the four phase shifted signals from a first of the two dividers-by-two which is the master-slave divider and supplying a selected one of the four phase shifted signals to the second of the two dividers-by-two, control signals being supplied to said selector unit in order for it to supply at its output a selected one of the four phase shifted signals in a division period determined as a function of a selected division mode, and
   a control unit for supplying the control signals to the selector unit, said control unit receiving an output signal of one of the dividers-by-two for clocking operations in the control unit and a signal for selecting the mode, said circuit dividing the frequency of at least one high-frequency signal by a first factor in a first selected mode and by a second factor in a second selected mode,
   wherein, in a selected one of the first and second modes, the control unit is adapted to supply control signals to the selector unit so that it effects phase switching in each division period between two selected phase shifted signals, which are approximately of sinusoidal shape, the second phase shifted signal being in phase lead of 90° in relation to the first phase shifted signal.

2. The prescaler circuit according to claim 1, wherein said selector unit comprises a first selector branch receiving two first phase shifted signals, a second selector branch receiving two second phase shifted signals, and a selection element connected to each branch, the control signals being supplied to the first and second branches and to the selection element.

3. The prescaler circuit according to claim 2, wherein each branch comprises a differential amplifier for amplifying the received phase shifted signals, each amplifier being controlled by one of the respective control signals in order to supply at its output one of the two phase shifted signals.

4. The prescaler circuit according to claim 2, wherein the first branch receives two phase shifted signals in phase opposition, the second branch receives two other phase shifted signals in phase opposition, and the control signals are such that, on phase switching between first and second selected phase shifted signals in the selection element of the selector unit, the selection of the second phase shifted signal in one of the respective branches is effected in a period preceding phase switching in the selection element.

5. The prescaler circuit according to claim 1, wherein the phase selector unit is between the first and second dividers-by-two and receives the four signals from the master-slave first divider-by-two.

6. The prescaler circuit according to claim 1, wherein it comprises six asynchronous dividers-by-two to obtain frequency division by a factor equal to 64 in a first mode wherein the control signals do not change state in each particular division period so only one of the four phase shifted signals is selected in the selector unit and to obtain frequency division by a factor equal to 63,5 in a second mode wherein, in each particular division period, certain control signals change state to effect phase switching between a first phase shifted signal and a second phase shifted signal in phase lead of 90° in relation to the first phase shifted signal so that the selector unit supplies at its output a different one of the four phase shifted signals at the end of each division period.

7. The prescaler circuit according to claim 1, wherein the control unit comprises two D-type flip-flops clocked synchronously by the output signal of the last divider-by-two and an arrangement of logic gates for supplying control signals to the selector unit.

8. The prescaler circuit according to claim 7, wherein a first inverter is placed between a non-inverting output and an input of the first flip-flop, the output signal of the first flip-flop supplying the control signal of the selection element, wherein an XOR logic gate receives at its input the output signal of the first flip-flop and a non-inverting output signal of the second flip-flop, to supply an input signal of the second flip-flop that corresponds to the control signal of the first branch, and wherein a second inverter is connected to the non-inverting output of the second flip-flop, to supply the control signal of the second branch.

9. The prescaler circuit according to claim 1, wherein the control unit includes a non-volatile memory, for example a read-only memory, for storing a plurality of binary words at particular locations, each binary word representing the state of the control signals for each particular division period, and a counter clocked by the output signal of the last divider-by-two, to send a successive memory location on each counter transition in a second selected mode or to maintain a particular memory location in a first selected mode.

* * * * *